(12) United States Patent
Tseng et al.

(10) Patent No.: US 11,474,136 B2
(45) Date of Patent: Oct. 18, 2022

(54) METHOD FOR EXAMINING DIFFERENTIAL PAIR TRANSMISSION LINES

(71) Applicants: INVENTEC (PUDONG) TECHNOLOGY CORPORATION, Shanghai (CN); INVENTEC CORPORATION, Taipei (TW)

(72) Inventors: Chun I Tseng, Taipei (TW); Yen-Hao Chen, Taipei (TW)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 481 days.

(21) Appl. No.: 16/714,401

(22) Filed: Dec. 13, 2019

(65) Prior Publication Data

US 2021/0072299 A1    Mar. 11, 2021

(30) Foreign Application Priority Data

Sep. 6, 2019    (CN) .......................... 201910846948.1

(51) Int. Cl.
| | |
|---|---|
| *G01R 27/28* | (2006.01) |
| *G01R 27/32* | (2006.01) |
| *H01P 3/08* | (2006.01) |
| *H05K 1/02* | (2006.01) |

(52) U.S. Cl.
CPC ............ *G01R 27/28* (2013.01); *G01R 27/32* (2013.01); *H01P 3/081* (2013.01); *H05K 1/0245* (2013.01)

(58) Field of Classification Search
CPC ......... G01R 27/28; G01R 27/32; H01P 3/081; H05K 1/0245
See application file for complete search history.

(56) References Cited

U.S. PATENT DOCUMENTS

| | | | |
|---|---|---|---|
| 6,677,831 B1 * | 1/2004 | Cheng ................... | H05K 1/025 333/236 |
| 2019/0271741 A1 * | 9/2019 | Peschke ............. | G01R 1/06788 |

FOREIGN PATENT DOCUMENTS

| | | | | |
|---|---|---|---|---|
| CN | 106487462 A | * | 3/2017 | ............. G01R 27/26 |
| CN | 108736456 A | * | 11/2018 | ............... H02H 1/00 |
| JP | 2019-184606 A | * | 10/2019 | ............. G01R 31/02 |

\* cited by examiner

*Primary Examiner* — Nasima Monsur
*Assistant Examiner* — Dilara Sultana
(74) *Attorney, Agent, or Firm* — Maschoff Brennan

(57) ABSTRACT

A method for examining differential pair transmission lines, performed by a processor, comprising: capturing a plurality of first insertion losses of a first signal line within a frequency range and a plurality of second insertion losses of a second signal line within the frequency range, wherein the first signal line and the second signal line are configured to transmit a pair of differential signals; calculating a plurality of maximum error ratios between the first insertion losses and the second insertion losses within the frequency range; determining whether any one of the maximum error ratios is greater than or equal to an upper threshold; outputting a warning signal when the processor determines one of the maximum error ratios is greater than or equal to the upper threshold; and ending the method when the processor determines each one of the maximum error ratios is smaller than the upper threshold.

8 Claims, 6 Drawing Sheets

METHOD FOR EXAMINING DIFFERENTIAL PAIR TRANSMISSION LINES

CROSS-REFERENCE TO RELATED APPLICATIONS

This non-provisional application claims priority under 35 U.S.C. § 119(a) on Patent Application No(s). 201910846948.1 filed in China on Sep. 6, 2019, the entire contents of which are hereby incorporated by reference.

BACKGROUND

1. Technical Field

This disclosure relates to a method for examining differential pair transmission lines.

2. Related Art

With the increasing demands for high-speed transmission, the design of differential signal lines has been widely applied to various electronic products. At the same time, the transmission quality of the differential signal is getting more and more attention with the increases of frequency. There are many factors affecting the quality of transmission. In addition to the material quality of the printed circuit board, insertion loss is also an indicator for the loss of the overall transmission, and the insertion loss is usually measured by a network analyzer (VNA) in order to be obtained.

According to the current practice, the measured data can only be known if it's incorrect after the measurement is completed and the measured data is analyzed afterwards. Unless the abnormal data is obvious, it is not easy to immediately be aware of the incorrectness of the data under general circumstances.

Accordingly, there is a need for an improved method for method for examining differential pair transmission lines that at least improves the above disadvantages.

SUMMARY

According to one or more embodiment of this disclosure, a method for examining differential pair transmission lines, comprising: by a processor, capturing a plurality of first insertion losses of a first signal line within a frequency range and a plurality of second insertion losses of a second signal line within the frequency range, wherein the first signal line and the second signal line are configured to transmit a pair of differential signals; by the processor, calculating a plurality of maximum error ratios between the first insertion losses and the second insertion losses within the frequency range; by the processor, determining whether any one of the maximum error ratios is greater than or equal to an upper threshold; by the processor, outputting a warning signal when the processor determines one of the maximum error ratios is greater than or equal to the upper threshold; and by the processor, ending the method when the processor determines each one of the maximum error ratios is smaller than the upper threshold.

According to one or more embodiment of this disclosure, a method for examining differential pair transmission lines, comprising: by a processor, capturing a plurality of first insertion losses of a first signal line within a frequency range and a plurality of second insertion losses of a second signal line within the frequency range, wherein the first signal line and the second signal line are configured to transmit a pair of differential signals; by the processor, calculating a plurality of maximum error ratios between the first insertion losses and the second insertion losses within the frequency range; by the processor, determining whether any one of the maximum error ratios is greater than or equal to an upper threshold; by the processor, outputting a first warning signal when the processor determines one of the maximum error ratios is greater than or equal to the upper threshold; by the processor, ending the method when the processor determines each one of the maximum error ratios is smaller than the upper threshold; by the processor, converting the first insertion losses and the second insertion losses into a plurality of mixed mode insertion losses when the processor determines one of the maximum error ratios is greater than or equal to the upper threshold; by the processor, executing a linear regression method to convert the mixed mode insertion losses into a plurality of linear regression parameters; by the processor, calculating a plurality of errors between the mixed mode insertion losses and the linear regression parameters within the frequency range; by the processor, determining whether any one of absolute values of the errors is greater than or equal to a second upper threshold; by the processor, outputting a second warning signal when the processor determines one of the absolute values of the errors is greater than or equal to the second upper threshold; and by the processor, ending the method when the processor determines each one of the absolute values of the errors is smaller than the second upper threshold.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Generally, there are two types of transmission lines used on printed circuit boards, one is strip line and the other is microstrip line. Under an ideal circumstance, the insertion losses of the two transmission lines are the same since the differential signals are transmitted through two signal lines having the same structural design. The present disclosure utilizes this symmetrical nature as a theoretical basis for examining the abnormalities of differential pair transmission lines.

Figure 1:
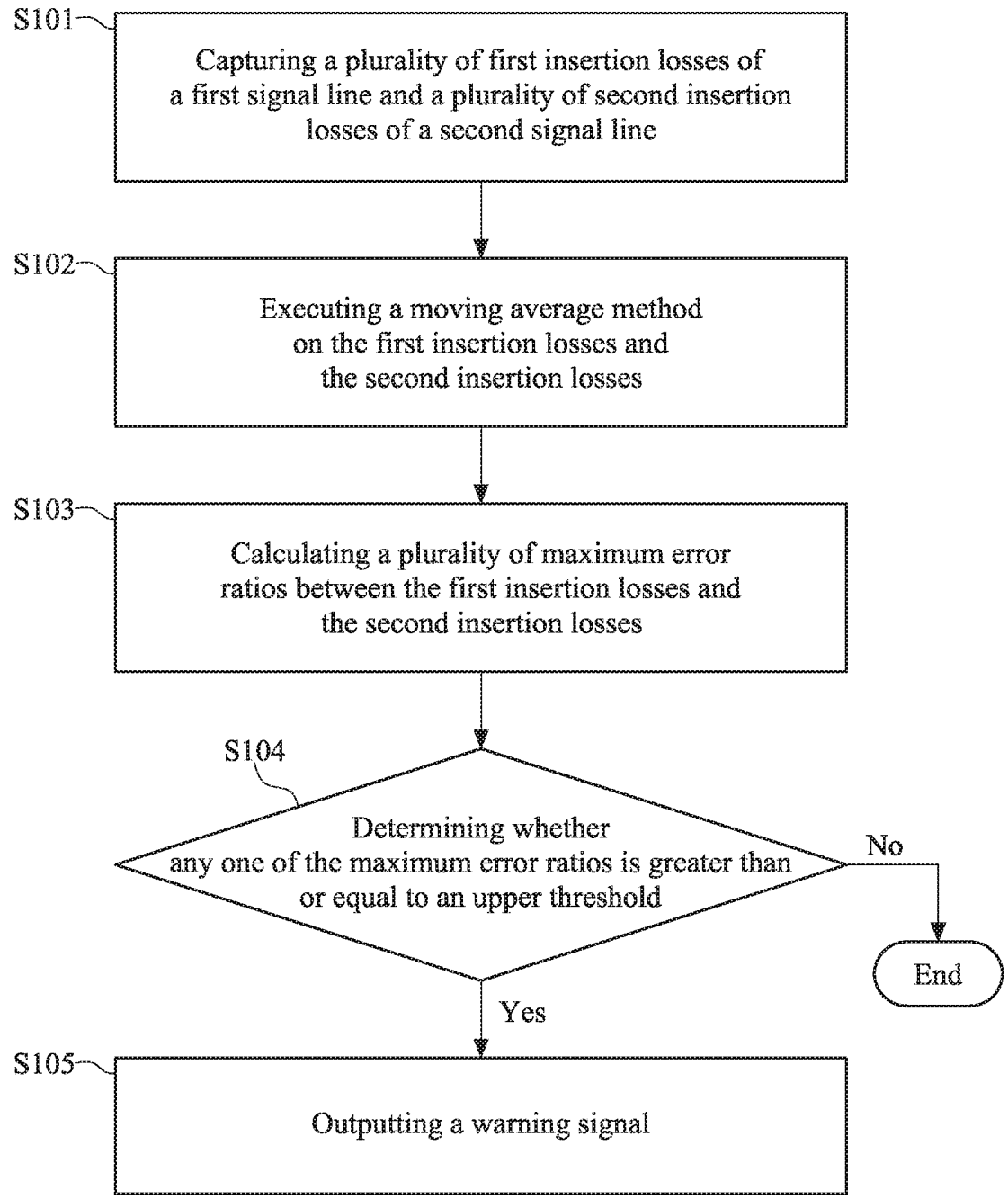
FIG. 1 is a flow chart of a method for examining differential pair transmission lines according to a first embodiment of the present disclosure.
Figure 2:
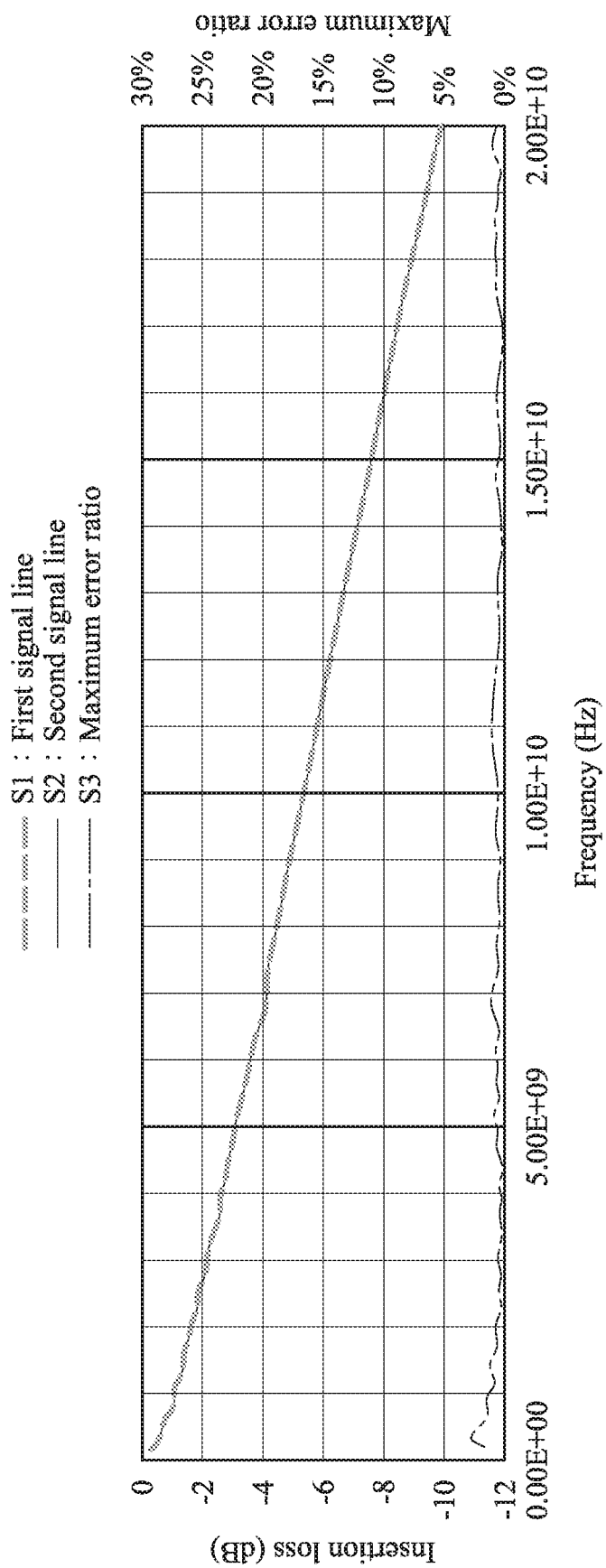
FIG. 2 is a relation graph between insertion losses and maximum error ratios of two strip lines according to an embodiment of the present disclosure.

FIG. 1 is a flow chart of a method for examining differential pair transmission lines according to a first embodiment of the present disclosure, and FIG. 2 is a relation graph between insertion losses and maximum error ratios of two strip lines according to an embodiment of the present disclosure. Please refer to both FIG. 1 and FIG. 2, in the embodiment, a first signal line and a second signal line are two strip lines disposed at a printed circuit board which have the same structures and are configured to transmit differential signals. In step S101, when the first signal line and the second signal line transmit the differential signals, a processor of a network analyzer captures a plurality of first insertion losses of the first signal line within a designated frequency range and a plurality of second insertion losses of the second signal line within the designated frequency range. Wherein, the processor can be a central processing unit (CPU), a digital signal processor (DSP), a microprocessor, a graphics processing unit (GPU) or a microcontroller. The designated frequency range can be from 1 Hz to 20 GHz. Specifically, the processor samples at multiple frequency points, so that the processor can capture a first insertion loss of the first signal line and a second insertion loss of the second signal line at every sampling frequency point.

In step S102, the processor executes a moving average method on the first insertion losses to generate a plurality of first flattened insertion losses, and the first flattened insertion losses constitute a first flattened insertion loss curve. Similarly, the processor executes the moving average method on the second insertion losses to generate a plurality of second flattened insertion losses, and the second flattened insertion losses constitute a second flattened insertion loss curve. Thereby flatten the excessive disturbance of the measured data and increase the readability of the data.

As shown in FIG. 2, under a low frequency condition, the first flattened insertion losses of the first signal line S1 and the second flattened insertion losses of the second signal line S2 become greater as the frequency becomes higher. When the frequency reaches to 20 GHz, the first flattened insertion losses of the first signal line S1 and the second flattened insertion losses of the second signal line S2 are each about −10 decibels (dB).

Since the characteristic of the transmission line is that greater insertion losses are generated when the frequency is higher, if a single absolute value of an error is designated as the standard for determining whether the measured data is incorrect, it will cause the tolerable error at higher frequency become too strict. In order to have different tolerable error standards for different frequency bands, in step S103 of the present embodiment, the processor calculates a plurality of maximum error ratios between the first flattened insertion losses and the second insertion losses within the designated frequency range, and uses the maximum error ratio of each frequency point as the standard for determining the error of the data. Wherein, the formula for calculating the maximum error ratio is defined as: $\text{Max}(\text{abs}((L1-L2)/L1)), \text{abs}((L1-L2)/L2))$, wherein "Max" is a maximum value operating function, "abs" is an absolute value operating function, "L1" is the insertion losses of the first signal line, and "L2" is the insertion losses of the second signal line. Understandably, since the insertion losses of the first signal line and the insertion losses of the second signal line are adjusted beforehand by the moving average method, the insertion losses of the first signal line and the second signal line in the maximum error ratio formula described above should respectively be flattened insertion losses. As shown in FIG. 2, the maximum error ratios S3 constitute a maximum error ratio curve with respect to the first signal line S1 and the second signal line S2, and the maximum error ratio at each frequency point is less than 5%.

In step S104, the processor determines whether any one of the maximum error ratios is greater than or equal to an upper threshold set by the processor. For example, the processor can set the upper threshold as 2%, but not limited thereto. When the processer determines one of the maximum error ratios is greater than or equal to the upper threshold, the processor then performs step S105. On the contrary, when the processor determines each one of the maximum error ratios is smaller than the upper threshold, then the method is ended instead of continuing to step S105.

In detail, when the maximum error ratio is greater than the upper threshold, it means that there may be some abnormalities in the measuring environment on the printed circuit board, for example, the solder joint between the strip line and the printed circuit board falls off, or the strip line is damaged. When the amount of frequency points presented at which the maximum error ratio is greater than or equal to the upper threshold increases, it means there are more abnormalities occurred in the measuring environment on the printed circuit board. On the contrary, when the maximum error ratio is smaller than the upper threshold, it means the offset ratio between the measured data of the two strip lines is small. It is thereby determined that there's a small chance that abnormality occurs in the measuring environment on the printed circuit board.

Continuing from step S104, in step S105, the processor outputs a warning signal. The warning signal, for example, includes an audio signal and an optic signal, and the optic signal has a flashing frequency to instantly notify a user to correct the abnormal measuring environment.

Figure 3:
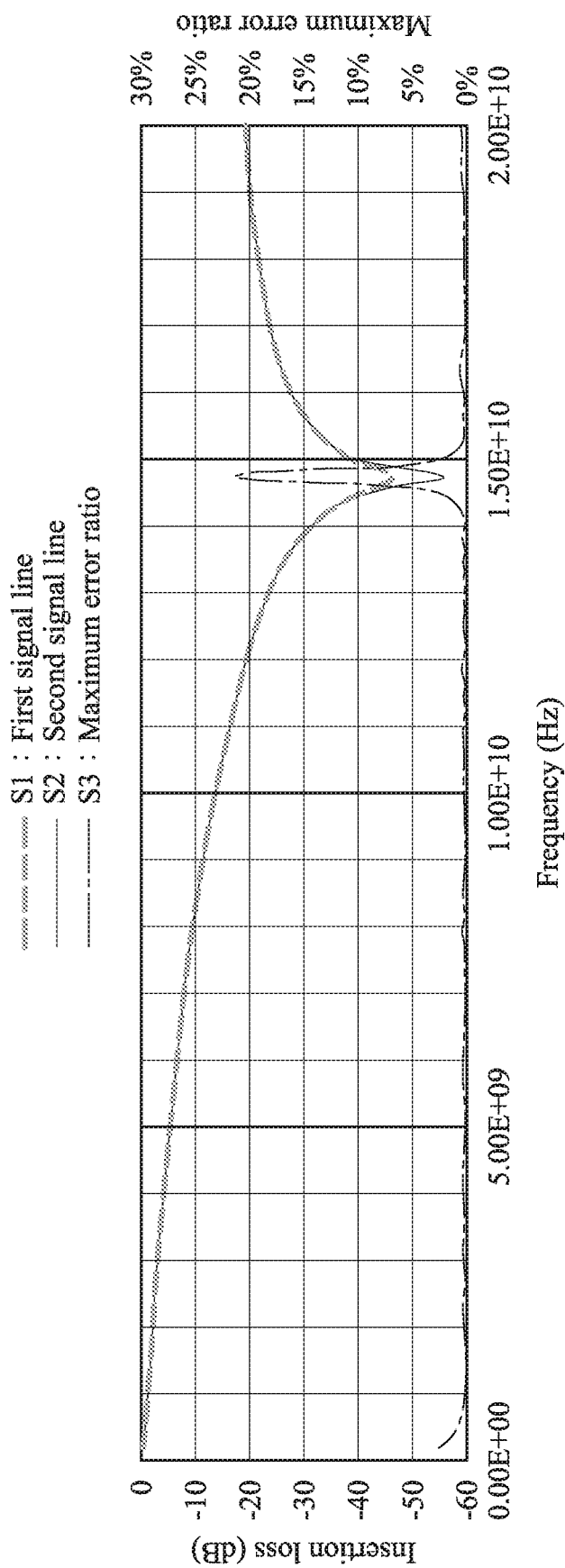
FIG. 3 is a relation graph between insertion losses and maximum error ratios of two microstrip lines according to an embodiment of the present disclosure.

FIG. 3 is a relation graph between insertion losses and maximum error ratios of two microstrip lines according to an embodiment of the present disclosure. As shown in FIG. 3, due to the physical properties of the microstrip line itself, resonance will occur at a certain frequency point (about 15 GHz), and the maximum error ratio that is greater than the upper threshold occurs at the resonance frequency point. According to the first embodiment of the method of detecting the differential signal, it is determined that the offset ratio between the measured data of the first signal line S1 and the measured data of the second signal line S2 at the resonance frequency point exceeds a predetermined standard. In order to further analyze whether the offset ratio is a reasonable physical characteristic representation of the microstrip line, the present disclosure further provides a second embodiment of a method for examining the differential pair transmission lines to perform multiple evaluations on the measured data of the microstrip lines.

Figure 4:
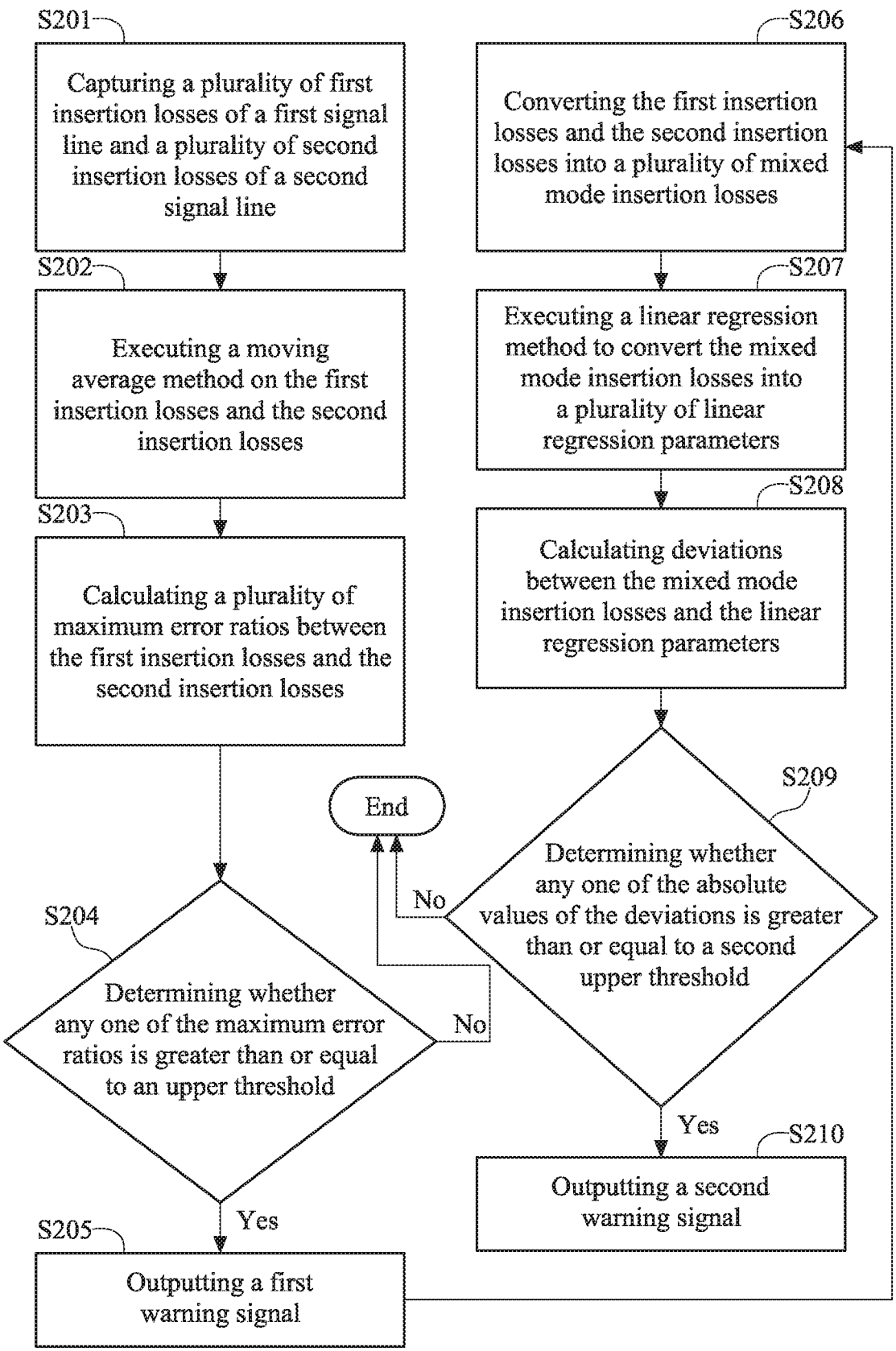
FIG. 4 is a flow chart of a method for examining differential pair transmission lines according to a second embodiment of the present disclosure.
Figure 5:
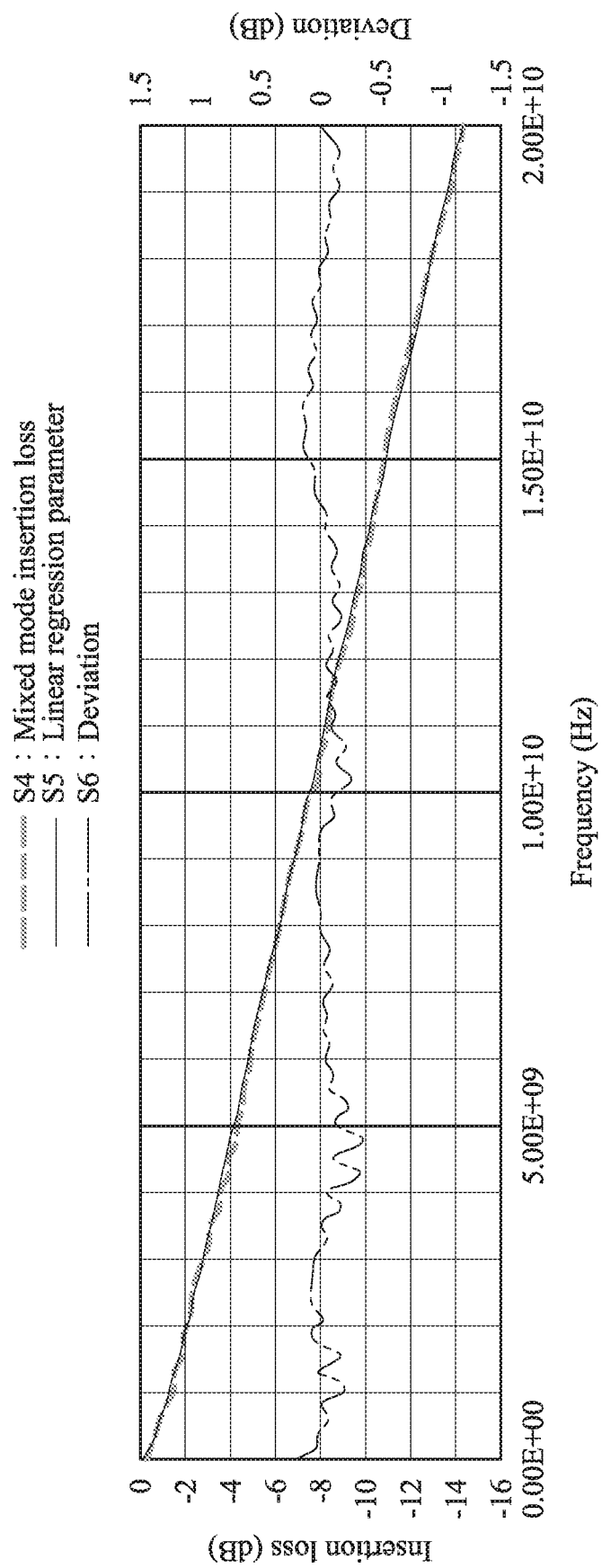
FIG. 5 is a relation graph between insertion losses of mixed modes and linear regression parameters of two microstrip lines according to an embodiment of the present disclosure.

FIG. 4 is a flow chart of a method for examining differential pair transmission lines according to a second embodiment of the present disclosure, and FIG. 5 is a relation graph between insertion losses of mixed modes and linear regression parameters of two microstrip lines according to an embodiment of the present disclosure. Comparing the second embodiment of FIG. 4 with the first embodiment of FIG.

1, wherein steps S201-S205 are substantially the same as steps S101-S105, the second embodiment further incudes steps S206-S211. In the second embodiment, the first signal line and the second signal line are two microstrip lines which have the same structures and are disposed on the printed circuit board. In step S204, the processor determines whether any one of the maximum error ratios is greater than or equal to a first upper threshold set by the processor. If one of the maximum error ratios is greater than or equal to the first upper threshold, the processor performs step S205; otherwise, the processor ends the method. In step S205, the processor outputs a first warning signal, the first warning signal, for example, includes an audio signal and an optic signal, and the optic signal has a flashing frequency to notify the user to check the measuring environment. When the result of measurement is, for example, the resonance of the microstrip lines causes the maximum error ratio to be greater than the first upper threshold, then the processor continues to perform step S206 after performing step S205.

Refer to FIG. 4 and FIG. 5 together, in step S206, the processor converts the first insertion losses and the second insertion losses into a plurality of mixed mode insertion losses S4. The mixed mode insertion losses S4 belong to the mixed mode scattering parameters. The mixed mode insertion losses S4 constitute a mixed mode insertion loss curve with respect to the first signal line and the second signal line. The mixed mode insertion losses S4 is considered at the same time based on the equilibrium of the first signal line and the second signal line, meaning the mixed mode insertion loss curve does not present the resonance.

In order to solve the problem of the mixed mode insertion losses S4 having a nonlinear performance at low frequency, in step S207, the processor executes a linear regression method by executing segmented regional linear regression to convert the mixed mode insertion losses S4 into a plurality of linear regression parameters S5. As shown in FIG. 5, the linear regression parameters S5 constitute a linear regression baseline with respect to the first signal line and the second signal line.

Linear regression is a regression analysis that uses the least square function of linear regression equations to model the relationship between one or more independent variables and dependent variables. This kind of function is a linear combination of one or more model parameters that are referred to as regression coefficients. A linear regression with only one independent variable is referred to as simple regression, a linear regression with more than one independent variable is referred to as multivariate linear regression. In linear regression, a model of the data is built using a linear prediction function, and the unknown model parameters are estimated through the model of the data. These models are called linear models. The most commonly used linear regression model is that the conditional mean of y for a given X is an affine function of X. However, in a less general case, the linear regression model can be a median, or under some other conditions with a given X, the quantile of the conditional distribution of y is represented as a linear function of X. Like all forms of regression analysis, linear regression also focuses on the conditional probability distribution of y for a given X, rather than the joint probability distribution of X and y.

In step S208, the processor calculates deviations S6 between the mixed mode insertion losses S4 and the linear regression parameters S5 within the designated frequency range. And the deviations S6 constitute a deviation curve with respect to the first signal line and the second signal line. As shown in FIG. 5, the deviation at each frequency point is between −0.5 dB-0.5 dB.

In step S209, the processor determines whether any one of the absolute values of the deviations S6 is greater than or equal to a second upper threshold set by the processor. In the present embodiment, the second upper threshold is different from the first upper threshold. For example, the processor can set the second upper threshold as 0.2 dB, but not limited thereto. When the processor determines one of the absolute values of the deviations S6 is greater than or equal to the second upper threshold, it means that there may be some abnormalities in the measuring environment on the printed circuit board, for example, the solder joint between the strip line and the printed circuit board falls off, or the strip line is damaged, the processor then performs step S210. When the processor determines each of the absolute values of the deviations S6 is smaller than the second upper threshold, the processor ends the method. In step S210, the processor outputs a second warning signal, for example, includes an audio signal and an optic signal to instantly notify the user to correct the abnormal measuring environment, and the flashing frequency of the second warning signal is different from the flashing frequency of the first warning signal.

Figure 6:
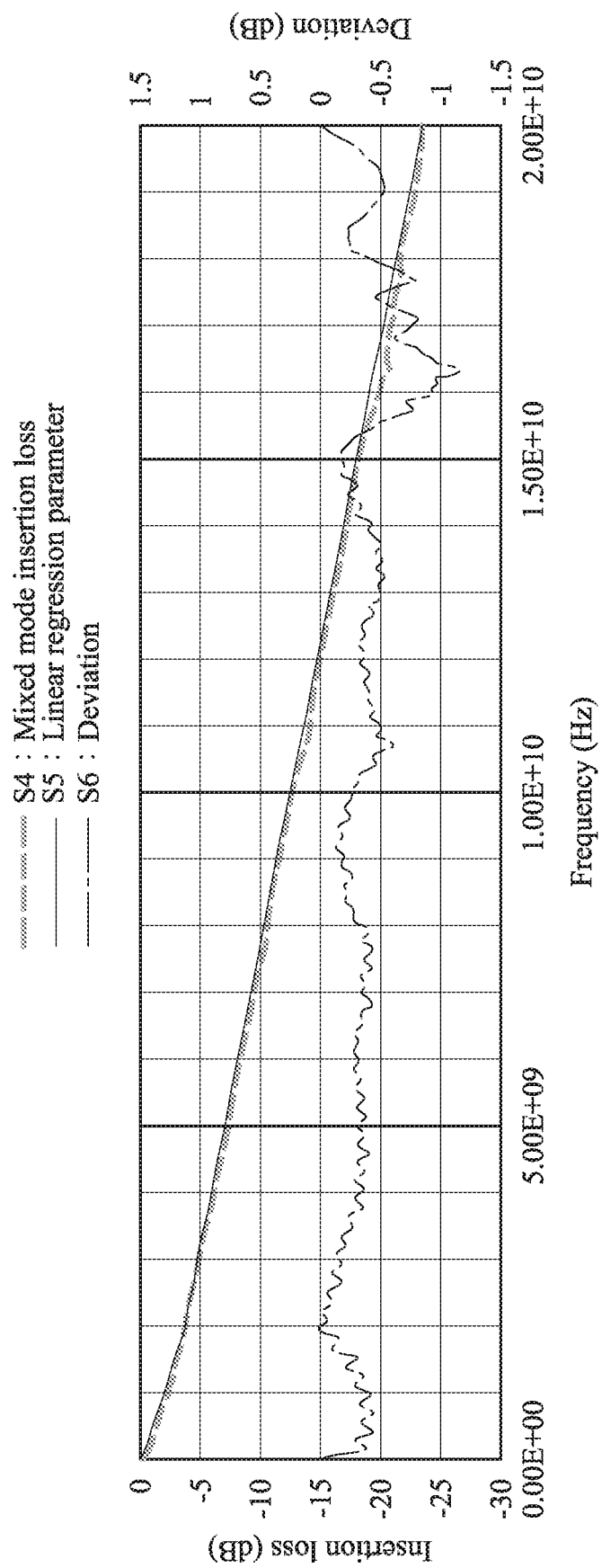
FIG. 6 is a relation graph between insertion losses of mixed modes and linear regression parameters of two microstrip lines according to another embodiment of the present disclosure.

FIG. 6 is a relation graph between insertion losses of mixed modes and linear regression parameters of two microstrip lines according to another embodiment of the present disclosure. Comparing FIG. 6 with FIG. 5, it can be known that the deviations S6 between the mixed mode insertion losses S4 and the linear regression parameters S5 in FIG. 6 are greater, meaning there are more abnormalities occur in the measuring environment on the printed circuit board.

In view of the above description, the method for examining differential pair transmission lines of the present invention utilizes the maximum error ratio curve between two insertion losses, so that the quality of the measured data also the measuring environment may be easily evaluated. In addition, the method further utilizes the deviations between the mixed mode insertion losses and the linear regression parameters to evaluate whether there are any undesired singular points in the overall data. Such multiple verification methods may be used to easily grasp the difference, to make sure to instantly correct the errors of measured data. The present disclosure effectively improves the disadvantage of only discovering the errors by analyzing data afterwards in the prior art.

The present disclosure has been disclosed above in the embodiments described above, however it is not intended to limit the present disclosure. It is within the scope of the present disclosure to be modified without deviating from the essence and scope of it. It is intended that the scope of the present disclosure is defined by the following claims and their equivalents.

What is claimed is:

1. A method for examining differential pair transmission lines, comprising:
   by a processor, capturing a plurality of first insertion losses of a first signal line within a frequency range and a plurality of second insertion losses of a second signal line within the frequency range, wherein the first signal line and the second signal line are configured to transmit a pair of differential signals;
   by the processor, calculating a plurality of maximum error ratios between the first insertion losses and the second insertion losses within the frequency range;

by the processor, determining whether any one of the maximum error ratios is greater than or equal to an upper threshold;

by the processor, outputting a warning signal when the processor determines one of the maximum error ratios is greater than or equal to the upper threshold; and by the processor, ending the method when the processor determines each one of the maximum error ratios is smaller than the upper threshold, wherein a formula for calculating the maximum error ratios is defined as: Max(abs((L1−L2)/L1)), abs((L1−L2)/L2)), wherein "Max" is a maximum value operating function, "abs" is an absolute value operating function, "L1" is the insertion losses of the first signal line, and "L2" is the insertion losses of the second signal line.

2. The method for examining differential pair transmission lines according to claim 1, wherein after capturing the first insertion losses of the first signal line and the second insertion losses of the second signal line by the processor, and before calculating the maximum error ratios by the processor, the method further comprising: by the processor, executing a moving average method to flatten the first insertion losses and the second insertion losses.

3. The method for examining differential pair transmission lines according to claim 1, wherein the first signal line and the second signal line are disposed at a printed circuit board, the first signal line and the second signal line are two strip lines.

4. The method for examining differential pair transmission lines according to claim 1, wherein the processor is located in a network analyzer.

5. A method for examining differential pair transmission lines, comprising:

by a processor, capturing a plurality of first insertion losses of a first signal line within a frequency range and a plurality of second insertion losses of a second signal line within the frequency range, wherein the first signal line and the second signal line are configured to transmit a pair of differential signals;

by the processor, calculating a plurality of maximum error ratios between the first insertion losses and the second insertion losses within the frequency range;

by the processor, determining whether any one of the maximum error ratios is greater than or equal to an upper threshold;

by the processor, outputting a first warning signal when the processor determines one of the maximum error ratios is greater than or equal to the upper threshold;

ending the method when the processor determines each one of the maximum error ratios is smaller than the upper threshold;

by the processor, converting the first insertion losses and the second insertion losses into a plurality of mixed mode insertion losses when the processor determines one of the maximum error ratios is greater than or equal to the upper threshold;

by the processor, executing a linear regression method to convert the mixed mode insertion losses into a plurality of linear regression parameters;

by the processor, calculating deviations between the mixed mode insertion losses and the linear regression parameters within the frequency range;

by the processor, determining whether any one of absolute values of the deviations is greater than or equal to a second upper threshold;

by the processor, outputting a second warning signal when the processor determines one of the absolute values of the deviations is greater than or equal to the second upper threshold; and by the processor, ending the method when the processor determines each one of the absolute values of the deviations is smaller than the second upper threshold, wherein a formula for calculating the maximum error ratios is defined as: Max(abs((L1−L2)/L1)), abs((L1−L2)/L2)), wherein "Max" is a maximum value operating function, "abs" is an absolute value operating function, "L1" is the insertion losses of the first signal line, and "L2" is the insertion losses of the second signal line.

6. The method for examining differential pair transmission lines according to claim 5, after capturing the first insertion losses of the first signal line and the second insertion losses of the second signal line by the processor, and before calculating the maximum error ratios by the processor, the method further comprising: by the processor, executing a moving average method to flatten the first insertion losses and the second insertion losses.

7. The method for examining differential pair transmission lines according to claim 5, wherein the first signal line and the second signal line are disposed at a printed circuit board, the first signal line and the signal line are two microstrip lines.

8. The method for examining differential pair transmission lines according to claim 5, wherein the processor is located in a network analyzer.

* * * * *